United States Patent
Kocher et al.

[11] Patent Number: 6,127,835
[45] Date of Patent: Oct. 3, 2000

[54] APPARATUS AND METHOD FOR ASSEMBLING TEST FIXTURES

[75] Inventors: Douglas Kocher; Jon Gordon, both of Portland, Oreg.

[73] Assignee: AQL Manufacturing Services, Inc., Wilsonville, Oreg.

[21] Appl. No.: 09/132,996

[22] Filed: Aug. 12, 1998

[51] Int. Cl.[7] .................................................. G01R 31/02
[52] U.S. Cl. ........................................ 324/761; 324/754
[58] Field of Search ................................... 324/761, 754, 324/755, 757, 758

[56] References Cited

U.S. PATENT DOCUMENTS

| | | |
|---|---|---|
| 4,132,948 | 1/1979 | Katz . |
| 4,618,820 | 10/1986 | Salvagno et al. . |
| 4,721,908 | 1/1988 | Driller et al. . |
| 4,912,400 | 3/1990 | Plante et al. . |
| 5,270,641 | 12/1993 | Van Loan et al. . |
| 5,493,230 | 2/1996 | Swart et al. . |
| 5,729,146 | 3/1998 | Swart ........................................ 324/754 |
| 5,798,654 | 8/1998 | Van Loan et al. ...................... 324/761 |
| 5,949,243 | 9/1999 | Grasso .................................... 324/761 |

*Primary Examiner*—Safet Metjahic
*Assistant Examiner*—T. R. Sundaram
*Attorney, Agent, or Firm*—ipsolon llp

[57] ABSTRACT

A test fixture assembly apparatus includes a removable loading plate with attached loading towers. The loading towers have guide plate shoulders oriented in a stair step fashion. The test fixture includes a bottom plate, plural guide plates and a target plate. The guide plates are removably loaded onto the loading towers with the towers extending through holes bored through the guide plates and sized such that the guide plates rest at a predetermined level on guide plate shoulders. The test fixture is fixed in place with cylindrical separator posts having slots that engage aligned notches on the guide plates and which are secured to the bottom and target plates. The loading plate and the loading tower are then removed from the assembled test fixture.

12 Claims, 4 Drawing Sheets

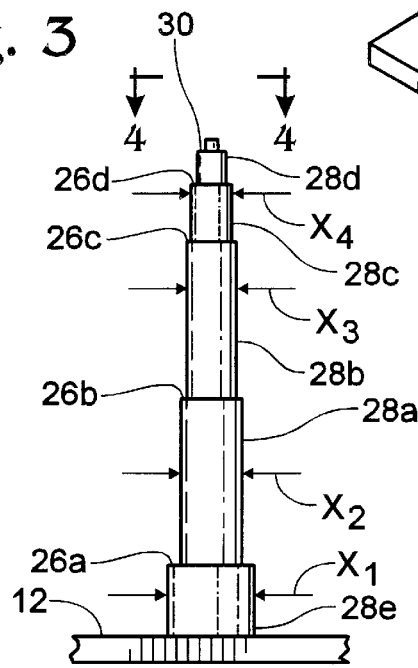
Fig. 3
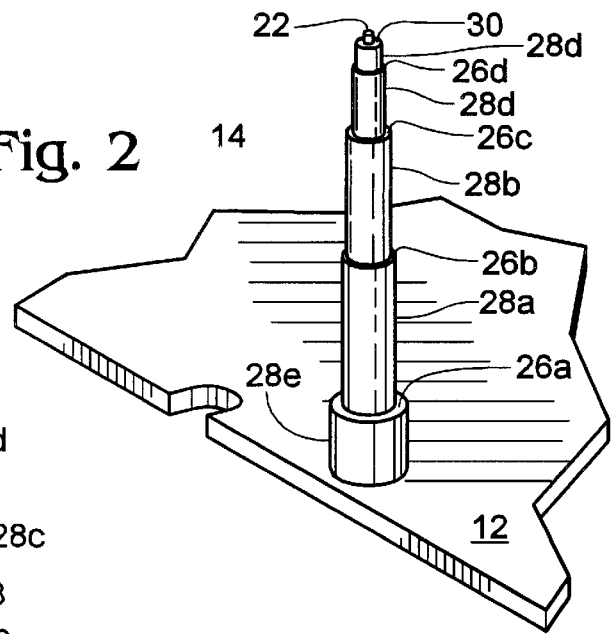
Fig. 2
Fig. 4
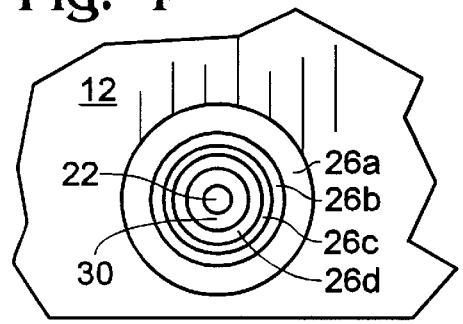
Fig. 5
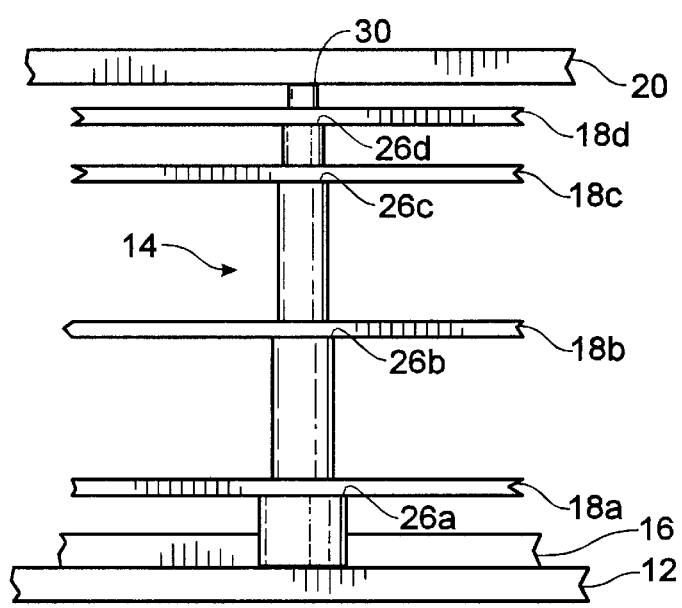

APPARATUS AND METHOD FOR ASSEMBLING TEST FIXTURES

FIELD OF THE INVENTION

This invention relates to test fixtures used in the process of testing and verifying the operation printed circuit boards, and more specifically to an improved test fixture and an improved apparatus and method for assembling test fixtures.

BACKGROUND AND SUMMARY OF THE INVENTION

Grid test fixtures, also commonly known as "grid translator fixtures," are used in conjunction with automated, computer-based testing equipment to test the functioning of printed circuit boards. In the process of testing the circuit boards, the test fixture serves as a framework structure that facilitates the establishment of an electrical contact between test points on the circuit board being tested on the one hand, and the testing equipment on the other hand. The number of circuits to be tested on any given circuit board can be quite large, numbering in the tens of thousands, and there typically is a switch for each individual test point. During the testing process the test equipment transfers test signals to selected circuits on the circuit board that is being tested, and a pass, no pass result is obtained. In this way the proper functioning of a circuit board can be quickly checked and verified.

Test fixtures of this type typically include a series of parallel, spaced apart plates, each having a plurality of test probe holes drilled therethrough in a predetermined specific pattern that corresponds to the pattern of test points on the circuit board to be tested. The plates are typically manufactured of a plastic material such as Lexan, G10 or FR4. Test probes, also called "test pins" or "translator pins" extend through the test probe holes in the test fixture plates. The test probes are used to establish electrical contact between test points on the circuit board on one side of the test fixture, and switches interconnecting the probes to the test analyzer on the opposite side of the test fixture. Because the array pattern of the test points on the circuit board is different from the array pattern of the test analyzer, many of the test probe holes drilled through any one plate in the test fixture will be in a slightly different position from the corresponding test probe holes drilled through the next adjacent plate. This results in the test probes being arranged in an image pattern on the circuit board side of the test fixture, and a gridded pattern on the opposite side of the test fixture. Given the many tens of thousands of test probes that may be included in a test fixture, the positioning of the test probe holes drilled through the plates must be precisely controlled. This is typically done with sophisticated computer controlled drilling equipment. But it is also critical that the test fixture is assembled in a controlled and precise manner to minimize any errors in the alignment of the plates. Thus, the plates must be properly oriented with respect to one another so that the test probe holes from one plate to the next are precisely aligned so that the test probes correctly fit through the holes.

In one traditional method of assembling grid test fixtures, the test fixture is assembled with a series of posts spaced around the periphery of the fixture that secure and separate the plates. The posts are constructed of a series of plastic or metal spacers that are inserted between the plates. The spacers separate the plates and hold them in a parallel array. Hollow rods are inserted through bores through the spacers to hold the spacers in the proper orientation. Test fixtures are assembled so that they can be inverted. This allows both sides of the circuit board to be tested. As such, with such traditional assembly arrangements, long connectors such as threaded bolts are typically inserted through the rods in order to hold the entire test fixture together in a fixed position. This manner of assembling test fixtures has several limitations. First, several different sizes of spacers are required because although the plates are parallel, they generally are not all evenly spaced from one another. This results in an increased number of parts that must be kept in inventory. Further, variances in the thickness of the spacers and the plates as a result of manufacturing tolerances for those parts can lead to misalignment of the plates when the test fixture is assembled. Since in any test fixture there are multiple plates, the cumulative effect of size variances in the spacers and the plates can lead to the plates being assembled in a non-parallel orientation. This in turn can lead to misalignment of the test probe holes between plates. Finally, assembling a test fixture in this way can be a time-consuming and tedious job.

An improved method of assembling test fixtures is disclosed in U.S. Pat. No. 5,729,146, entitled Quick Stacking Translator Fixture. In this patent, the spacer and rod type of assembly method is replaced with a series of one-piece stacking towers that have a series of translator plate support surfaces arranged in a stair-step fashion and separated by alignment posts. Each such support surface and corresponding adjacent alignment post is sized to support a translator plate that has been predrilled with a hole sized appropriately for its location on the stacking tower. This manner of assembling the test fixture automatically positions the translator plates at the proper, predetermined level in the text fixture. Outwardly projecting shoulders formed on the alignment posts cooperate with key slots formed on the translator plates to engage the translator plates. When the test fixture is assembled, the stacking posts are rotated to an angular position relative to the plates, causing the plates to pass under the shoulders on the stacking posts so that the shoulders all cooperate to hold the translator plates in position to provide a vertical restraint at each translator plate level.

Despite the improvements made to test fixtures over the years there remains a need for test fixtures that are assembled with precise parallel alignment between the plates. Further, there remains a distinct need for test fixtures that while meeting the requirements of precision in the assembly process are easily assembled in a minimal amount of time.

The present invention approaches the problems associated with assembling test fixtures and fixing the translator plates in position differently from previously known approaches. The test fixture of the present invention utilizes a removable loading plate having a series of loading towers spaced around the periphery of the plate. Predrilled test fixture plates are sequentially loaded onto the loading plate such that the loading towers extend through the holes in the plates. The loading towers have support steps upon which the plates rest at predetermined levels. Each test fixture plate has a series of preformed notches formed around the periphery of the plate. When all of the plates are loaded onto the loading towers, the notches in the plates align and separator posts having cooperative slots are inserted into the notches on the plates. The separator posts engage the notches to fix the plates into position. The top and bottom plates of the test fixture are secured in place with screws extending through the plates and into threaded openings in the separator posts, fixing the test fixture in precise alignment. At this point the loading plate and the loading towers are readily removed from the assembled test fixture.

The test fixture of the present invention is easily assembled. For instance, the separator posts, which lock the plates in a fixed position relative to one another, simply slide into the notches in the outer periphery of the plates. Each separator post has the same configuration, so there is a need to inventory only one part for each specific test fixture arrangement. In addition, the inherent size variances associated with manufacturing tolerances from multiple spacers are eliminated by using identical, unitary support posts. This leads to a high degree of precision in assembling the test fixture.

BRIEF DESCRIPTION OF THE DRAWINGS

FIG. 2 is a perspective view of a loading tower of the present invention.

FIG. 3 is a side elevational view of a loading tower of the present invention.

FIG. 4 is a top plan view of a loading tower of the present invention taken along the line 4—4 of FIG. 3.

FIG. 5 is a side elevation view of a loading tower of the present invention.

DETAILED DESCRIPTION OF PREFERRED EMBODIMENTS COMPONENTS

Figure 1:
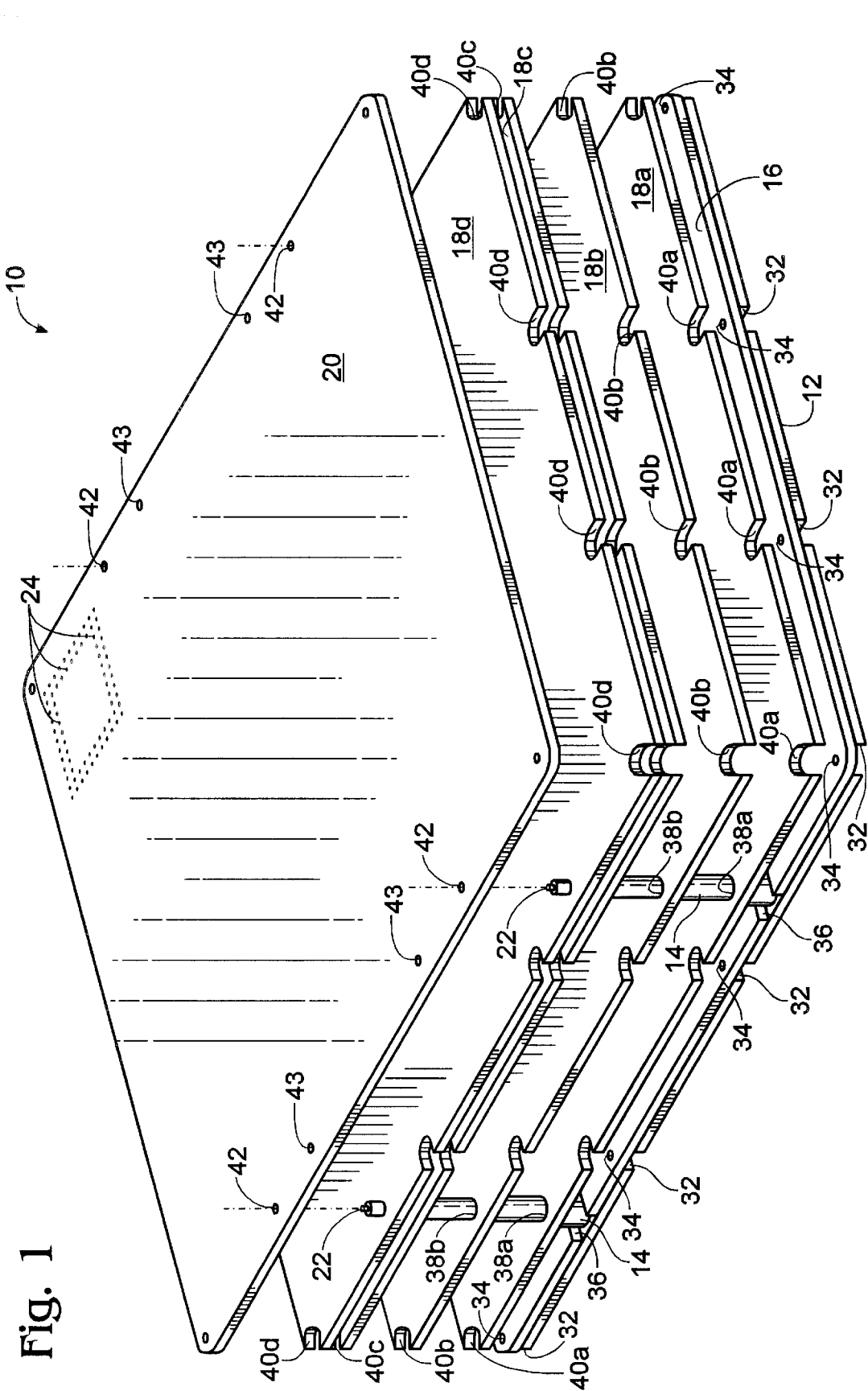
FIG. 1 is a perspective, partially exploded view of a partially assembled test fixture according to the present invention showing the test fixture with the removable loading plate still in place.

The preferred embodiment of a test fixture assembly 10 according to the present invention is shown in FIG. 1. The test fixture illustrated in FIG. 1 is partially assembled. Test fixture assembly 10 includes a removable loading plate 12 that has a plurality of loading towers 14 spaced around the periphery thereof. Two loading towers are shown in FIG. 1—two additional loading towers on the rear side of the test fixture are obscured in the figure. The number of loading towers used in any particular loading plate depends upon factors such as the size of the loading plate and the associated test fixture. The loading towers are fixed to the loading plate with screws extending through the loading plate and into threaded bores in the base of the towers.

Test fixture assembly 10 further includes a bottom plate 16, a plurality of guide plates 18 (labeled 18a through 18d in FIG. 1), and a target plate 20. In the assembled test fixture (FIGS. 10, 11), the guide plates are held in a spaced apart parallel orientation that defines a horizontal plate plane. The bottom plate and the target plate are also held parallel to the guide plates. The bottom plate defines a test fixture bottom surface, the target plate defines a test fixture top surface, and the opposite lateral edges of the bottom plate, the target plate and all of the guide plates in combination defined opposite lateral edges of the test fixture. Each loading tower includes a target plate guide pin 22 extending outwardly from the upper surface of the loading tower. The removable loading plate and the loading towers form no part of the finished test fixture, and are instead used only during the process of assembling the test fixture. The test fixture itself is made up of the bottom plate 16, the plural guide plates 18, the target plate 20 and selected other components such as separator posts 44.

It will be appreciated that the number of guide plates in a test fixture can vary, as can the distance between the guide plates, and the distance between the guide plates and the bottom plate and the target plate. Accordingly, the position at which the guide plates are engaged by the separator posts can vary. The number and positions of the guide plates shown in the figures is for illustrative purposes only.

In practice, both the bottom plate 16 and the target plate 20 are formed of a relatively thicker, relatively more rigid material than the guide plates 18 that are disposed in a parallel array between the bottom and target plates when the test fixture is assembled. The removable loading plate also is made of a relatively thicker and more rigid material than the guide plates. All of the plates are typically formed of a plastic material such as Lexan, G10 or FR4 that is easily drilled. For purposes of illustration only, several test probe holes 24 are shown in FIG. 1 drilled through target plate 20. These test probe holes are predrilled in the target plate in positions corresponding to and form a mirror image of the contacts on the circuit board that is being tested. The diameter of the test probe holes is also predetermined according to the size of the test probes that will be used with the specific circuit board being tested. Each guide plate and the bottom plate also has an identical set of predrilled test probe holes that are in predetermined positions to accept the test probes when they are inserted into the test fixture. As noted previously, the image pattern of the test probes on the circuit board side of the test fixture translates into a gridded pattern on the opposite side of the test fixture. It will therefore be appreciated that in most instances the test probe holes in each successive plate will be drilled in slightly different positions relative to the test probe holes in the next adjacent plate or plates. The methods of locating and drilling of the test probe holes are well known to those skilled in the art and do not form a part of this invention.

FIG. 2 illustrates a loading tower 14 affixed to removable loading plate 12. As noted previously, the loading tower is fixed in position on the loading plate with, for instance, a screw or some equivalent device. Each loading tower used in the present invention is identical in construction and is preferably formed out of a rigid integral plastic or nylon material that can be machined to precise tolerances. Loading tower 14 includes a plurality of vertically spaced apart guide plate shoulders 26–26a through 26d in FIG. 2—arranged in a stair step fashion and separated by vertically spaced apart guide plate orienting posts 28a through 28d. The uppermost surface of loading tower 14 forms a target plate shoulder 30. Target plate guide pin 22 extends outwardly from the center of target plate shoulder 30. Loading tower 14 further has a base section 28e, which is also sometimes referred to herein as the bottom plate orienting post.

As shown in FIGS. 2 through 4, the outer diameter of each successive guide plate shoulder is progressively smaller moving from guide plate shoulder 26a through guide plate shoulder 26d. Thus, referring to FIG. 3, the dimension labeled $X_1$ is the outer diameter of guide plate shoulder 26a. The dimension labeled $X_2$ is the outer diameter of guide plate shoulder 26b, and so on. Dimensionally, $X_1 > X_2 > X_3 > X_4$. As detailed below with regard to the process by which the test fixture is assembled, the guide plates 18 have predrilled guide plate holes with diameters that correspond to the diameters of the specific guide plate orienting posts 28 such that each guide plate rests on a corresponding specific guide plate shoulder 26.

Although both the guide plate shoulders and the guide plate orienting posts shown in the Figures are circular in cross section, other cross sectional configurations would work equally as well.

Referring again to FIG. 1, removable loading plate 12 includes a plurality of access notches 32 spaced around the periphery of the plate. Bottom plate 16, which during the assembly process lies immediately adjacent to and on top of the removable loading plate, has a plurality of countersunk holes 34 drilled through the plate and spaced around the periphery of the plate. Bottom plate 16 has a hole 34 for each notch 32 in the removable loading plate. As shown in FIG. 1, the countersunk holes 34 in bottom plate 16 are positioned such that they overlie the corresponding access notch 32 in loading plate 12 when the bottom plate overlies the removable loading plate. The access notches 32 permit access to countersunk holes 34 from the lower side of the test fixture.

Bottom plate 16 further includes a plurality of U-shaped loading tower notches 36 spaced around the periphery of the plate. Again as shown in FIG. 1, the U-shaped loading tower notches are located in positions around the periphery of the bottom plate that correspond to the positions of the loading towers on the removable loading plate. The U-shaped loading tower notches are sized to allow the base section 28e (that is, the bottom plate orienting post) of loading towers 14 to be received into the notches. Thus, the radius of the curved section of U-shaped loading tower notches 36 matches or is slightly greater than the radius of curvature of the base section 28e. This allows the base plate to be positioned and oriented precisely on the removable loading plate during assembly, wherein, as in FIG. 1, the loading tower base sections are nested in the U-shaped loading tower notches.

Each guide plate 18 also has a series of U-shaped notches and predrilled holes that facilitate assembly of the test fixture. With reference to FIG. 1, guide plate 18a has a plurality of predrilled loading tower holes 38a, one such hole for each loading tower 14. As detailed below, the loading towers extend into the loading tower holes during the assembly process and align and position the guide plates relative to the remaining plates in the test fixture. The diameter of the loading tower holes 38 through guide plate 18a, which is the lowermost guide plate shown in FIG. 1, are sized to closely match the outer diameter of the guide plate orienting posts at the level at which the guide plate is stacked. Yet the diameter of the loading tower holes 38 is smaller than the outer diameter of the guide plate orienting post sections that lie immediately below the guide plate when loaded on the tower. This allows the guide plate to rest on the guide plate shoulder. Thus, the diameter of the loading tower holes 38 in guide plate 18a is slightly greater than the diameter of the corresponding guide plate orienting post 28a at the appropriate level. With reference to the dimensions shown in FIG. 3, the diameter of the loading tower holes 38a in guide plate 18a (FIG. 1) is slightly greater than dimension $X_2$ but smaller than dimension $X_1$. In the preferred embodiment the tolerances between the outer diameter dimension of the loading tower at any particular level, and the corresponding loading tower hole in a guide plate is about 0.010 mil. In other words, the loading tower holes 38 are about 0.010 mil greater in size than the outer diameter of the guide plate orienting posts at the corresponding level. This size tolerance is sufficient to correctly position the guide plates on the guide plate shoulders, yet, as detailed below, allows enough clearance between the removable loading plate and attached loading towers so that the loading plate may be easily removed from the test fixture when it is fully assembled. The guide plates rest on the guide plate shoulders but are not attached to the loading towers. Instead, as explained below, for the purposes of the present invention it is important that the loading towers are readily removable from the guide plate holes.

Guide plate 18a further includes a plurality of U-shaped separator post notches 40a spaced around the periphery of the plate and opening to a lateral edge of the plate. As shown in FIG. 1, each separator post notch is in a position such that it aligns with a hole 34 in the underlying bottom plate 16.

Each additional guide plate 18 is similarly constructed to guide plate 18a. However, the loading tower holes 38 in each successive guide plate are sized to match the respective outer diameters of the guide plate orienting posts at the level at which the guide plate is stacked on the loading towers such that the loading towers extends through the holes 38 with the guide plate resting on the corresponding guide plate shoulders. Thus, the diameters of the loading tower holes 38b on guide plate 18b are slightly greater than the diameter of the corresponding guide plate orienting posts 28b. Again with reference to the dimensions shown in FIG. 3, the diameter of the loading tower holes 38b in guide plate 18b are slightly greater than dimension $X_3$. This same sizing pattern is repeated with each guide plate 18, and accordingly, the diameter of the loading tower holes 38 decreases moving from guide plate 18a to guide plate 18d. For ease of assembly, the guide plates (as well as the other plates in the test fixture) typically include indicia printed or stamped on the plates to indicate their respective sequential order of mounting on the loading towers.

Like guide plate 18a, each additional guide plate—18b through 18d in FIG. 1—includes a plurality of U-shaped separator post notches 40 spaced around the periphery of the plate in predetermined positions. As shown in FIG. 1, each separator post notch on each guide plate is positioned in vertical alignment with the separator post notch on the next adjacent guide plate along an axis extending transverse to the plane of the plates. The number of separator post notches varies with factors such as the size of the test fixture and the kind of circuits that will be tested. In the preferred embodiment, all of the separator post notches on all of the guide plates are of the same dimensions.

Figure 10:
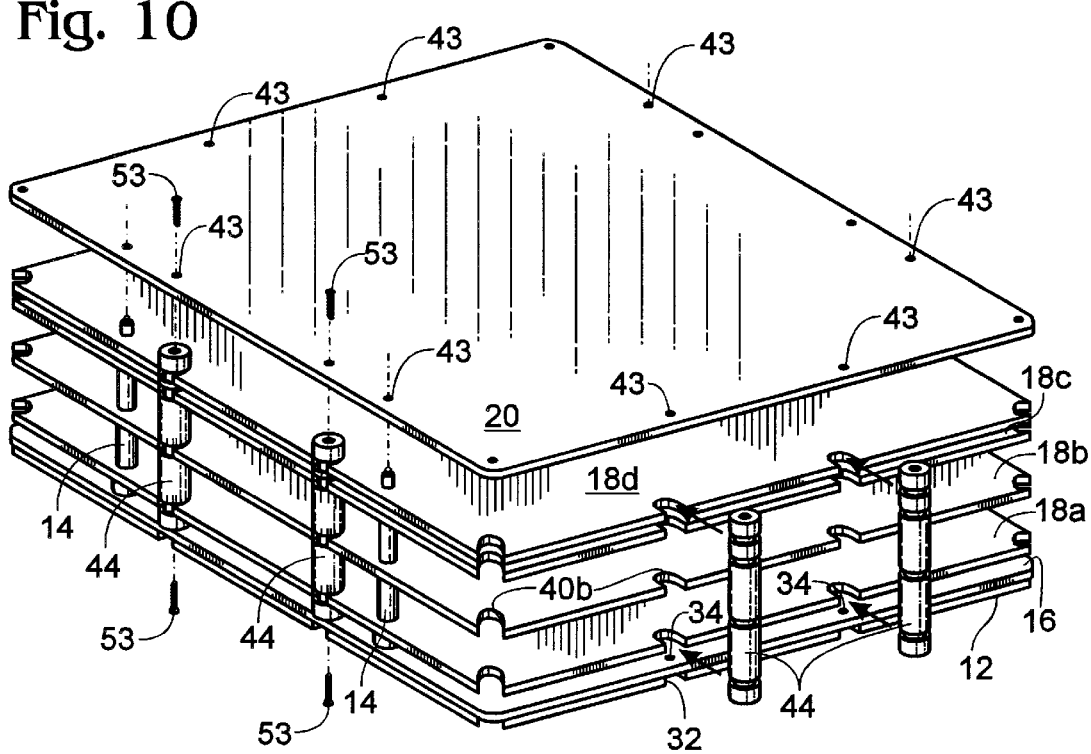
FIG. 10 is a perspective, partially exploded view of a partially assembled test fixture according to the present invention showing the test fixture with the removable loading plate still in place and with some separator posts installed, some being shown schematically prior to installation.
Figure 11:
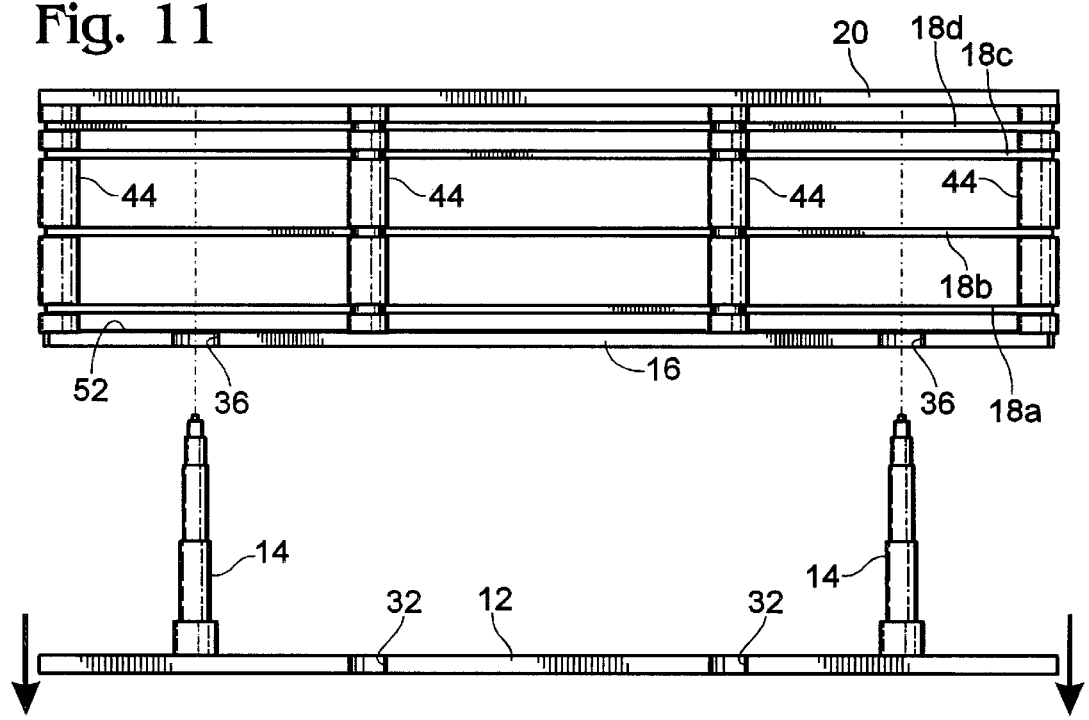
FIG. 11 is side elevational view of an assembled test fixture according to the present invention schematically showing the removable loading plate being removed from the test fixture.

Target plate 20 forms the uppermost plate of test fixture assembly 10 shown in FIG. 1. It includes target plate guide pin holes 42 located in positions to receive target plate guide pins 22 when target plate 20 is mounted on the loading towers (FIG. 10). There is one target plate guide pin hole 42 in target plate 20 corresponding to each loading tower 14. Target plate 20 further includes a plurality of countersunk holes 43 spaced around the periphery of the plate. Target plate 20 has a countersunk hole 43 for each separator post notch 40 in the underlying guide plates. As shown in FIG. 10, the countersunk holes 43 are positioned such that they overlie the corresponding vertically aligned separator post notches 40 when the target plate is mounted on the loading towers.

Figure 6:
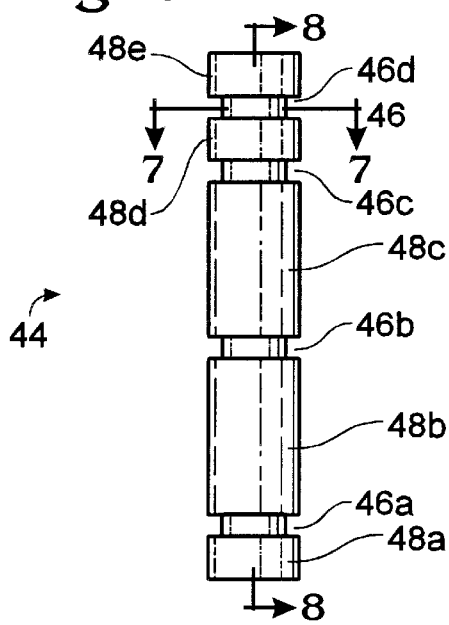
FIG. 6 is a side elevational view of a separator post of the present invention.

As shown in FIG. 6, the separator posts 44 (one of which is illustrated in FIG. 6) include a plurality of identical annular guide plate slots 46 (46a through 46d) spaced apart along the length of the post and separated by body sections 48 (48a through 48e). All of the separator posts are identical, and as described below, function to interconnect the guide plates, the bottom plate and the target plate, and to fix the positions of the plates relative to one another. The separator posts are preferably cylindrical columns and are preferably manufactured of a unitary piece of rigid plastic or nylon material that may be machined to precise tolerances. As detailed below, the positions of the annular guide plate slots are predetermined to correspond to the positions of the guide plates when they are mounted on the loading towers. The width of the guide plate slots matches or is slightly larger than the thickness of the guide plates.

Figure 7:
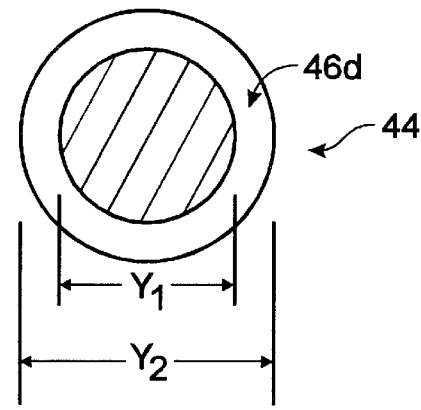
FIG. 7 is a cross sectional view of the separator post of FIG. 6, taken along the line 7—7 of FIG. 6.
Figure 8:
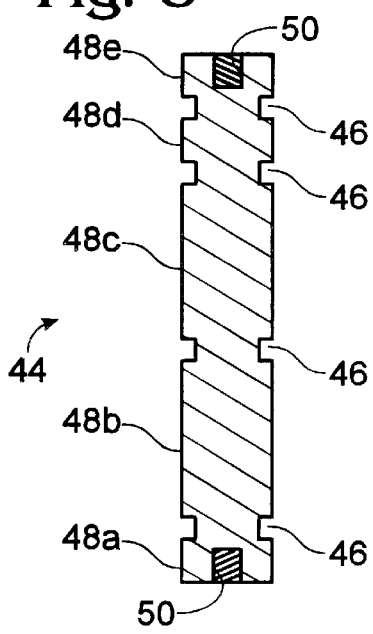
FIG. 8 is a cross sectional view of the separator post of FIG. 6, taken along the line 8—8 of FIG. 6.

As illustrated in FIG. 7, the outer diameter of the separator post in the annular guide plate slots is designated with the dimension $Y_1$. The outer diameter of the separator post is designated with the dimension $Y_2$. The dimension $Y_2 > Y_1$.

The separator posts 44 include threaded openings 50 in the center of the top surface and the bottom surface. (FIG. 6.)

Assembly

The test fixture is assembled by first attaching the desired number of loading towers 14 in the desired positions on a removable loading plate 12. With reference to FIG. 1, there are four loading towers (two of which are obscured in the figure) attached to the removable loading plate. The bottom plate 16 is then mounted on the removable loading plate by positioning U-shaped loading tower notches on bottom plate 16 adjacent the loading towers and sliding the bottom plate over the loading towers until the bottom plate rests on the loading plate with the base section 28e of the loading towers nested in the U-shaped loading tower notches 36. The nested positioning of the plural loading towers in the corresponding plural loading tower notches holds the bottom plate in a fixed position relative to the loading plate. The position of the bottom plate relative to the loading plate is shown in FIG. 5.

With base plate 16 correctly positioned on removable loading plate 12, the guide plates 18a through 18d are sequentially loaded onto the loading towers beginning with the lowermost guide plate 18a. As described above, the guide plate is loaded onto the loading towers 14 such that the towers insert into the loading tower holes 38 in the guide plate. As previously described, the loading tower holes 38 in each guide plate 18 are sized to match the size of the guide plate orienting posts on the loading towers at the level at which the guide plate will rest on the guide plate shoulders. Thus, as shown in FIG. 5, guide plate 18a Tests on guide plate shoulder 26a. Guide plate 18b rests on guide plate shoulder 26b, and so on. Because the loading tower holes in the guide plates are sized to rest on a predetermined guide plate shoulder, the guide plates may be sequentially loaded onto the loading towers in the proper order. That is, in view of the progressively decreasing size of the loading tower holes and the corresponding decrease in the size of the loading towers moving from the "a" level (i.e., guide plate shoulder 26a) to the "d" level, it is readily apparent when a plate is loaded onto the loading towers out of sequence. Loaded in this manner, each guide plate rests upon and is supported by a guide plate shoulder at the corresponding level on each of the plural loading towers.

With all of the guide plates loaded onto the loading towers, the target plate 20 is positioned atop the loading towers with the target plate guide pins 22 on the loading towers 14 protruding through the target plate guide pin holes 42 on the target plate 20. In this position the lower surface of the target plate rests on the target plate shoulder 30, as illustrated in FIG. 6.

The separator posts 44 are now ready to be slid into the vertically aligned U-shaped separator post notches 40a through 40d on the guide plates 18a through 18d such that the guide plate slots 46 engage the guide plates. FIG. 10 illustrates two separator posts 44 in an engaging position in the notches and two separator posts ready to be slid into the notches in the direction of the arrows in the Figure. In practice, depending upon factors such as the size of the test fixture, a separator post 44 would be inserted into each group of aligned separator post notches, although the test fixture is stabilized and aligned properly even when there are some groups of notches left without separator posts.

The outer diameter of the separator posts in annular guide plate slots 46 (i.e., dimension $Y_1$, FIG. 7) closely matches the width of the opening into the U-shaped separator post notches 40. Further, the radius of curvature of the curved, U-shaped section of the separator post notches closely matches the radius of curvature of the separator posts in the annular guide plate slots. And as noted before, the width of the guide plate slots matches the thickness of the guide plates. In the preferred embodiment, the tolerance between the outer diameter of the separator posts in annular guide plate slots 46—that is, dimension $Y_1$—is about 0.003 mil smaller than the width of the opening into separator post notches 40. That is, dimension $Y_1$ is preferably about 0.003 mil smaller than the width of the openings into notches 40. It has been found that this close tolerance is sufficient to maintain adequate precision in the positioning of the guide plates and the bottom and target plate relative to one another when the test fixture is assembled, and thus to properly align the test probe holes through the entire test fixture. Thus, in view of the relatively close tolerances in the clearance between the guide plate slots and the separator post notches, the separator posts function to align the plates relative to one another.

Figure 9:
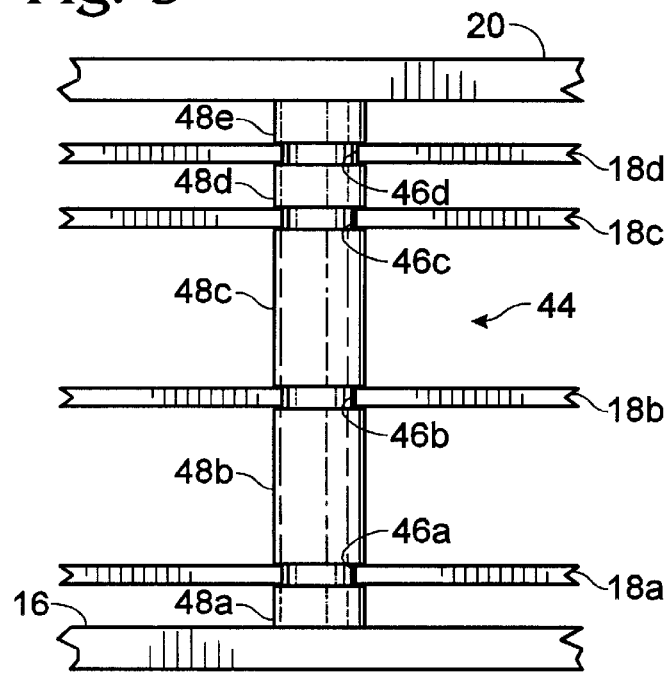
FIG. 9 is a side elevational view of a separator post of the present invention.

As shown in FIG. 9, which illustrates one separator post 44 in position in the test fixture, the guide plate slots 46 in the separator post engage the guide plates in the separator post notches when the separator post is inserted into an engaging position in the separator post notches. Because the width of the separator post notches 40 closely matches the dimension $Y_1$, as described above, and because the outer dimension of the separator posts $Y_2$ is greater than $Y_1$, each guide plate is supported on the upper surface and the lower surface by engagement with the separator post, and is thus retained in a fixed position relative to the other guide plates and relative to the bottom plate and the target plate. In this way all of the plates of the test fixture are positioned in a parallel array and with precise location.

The depth of the separator post notches 40 is dimensioned such that the separator posts 44 are slid inwardly into the notches until the inner walls of the annular guide plate slots abut the curved, U-shaped portion of the separator post notches. In this position the outermost edge of separator post is aligned flush with the outermost lateral edges of the plates of the test fixture. With regard to separator posts that engage the corners of the test fixture, the cylindrical outer margins of the separator post form the rounded corner of the test fixture. The separator posts thus nest in the separator post notches. In this position the threaded openings 50 on either end of the separator posts align with countersunk holes 34 on bottom plate 16 and countersunk holes 43 on target plate 20. Screws 53 are then inserted through the countersunk holes 34 and 43 and screwed into the threaded openings 50 to fix the entire test fixture in a rigid position with all of the plates correctly aligned.

With the separator posts engaging the guide plates as described, each guide plate is in an engaging relationship with, and is supported by a plurality of separator posts spaced around the periphery of the plate.

At this point the removable loading plate 12 and the attached loading towers 14 may be separated from the test fixture by lifting the test fixture upwardly away from the loading plate, or by moving the loading plate downwardly away from the test fixture. Because none of the plates of the test fixture are ever fixed to or otherwise retained on the loading towers, the test fixture is easily lifted away from the removable loading plate. Separation of the loading plate and the loading towers from the assembled test fixture is shown schematically in FIG. 11. Thus, the test fixture is separated from the loading plate by moving the loading plate in the direction of the arrows in FIG. 11. As may also be seen in FIG. 11, a retainer sheet 52 is disposed between bottom plate 16 and guide plate 18*a*. Retainer sheet 52 is made of a rubber material such as latex, or a fine-mesh nylon material, and functions to hold the test probes in place in the assembled test fixture.

While the invention has been described with reference to the preferred embodiments, certain substitutions of component parts could be made with equivalent results. For instance, although the preferred embodiment of the separator posts is cylindrical, the posts could also be made with a square or rectangular or other cross sectional configuration. In that event, the shape of the separator post notches on the guide plates would need to be adjusted accordingly. In addition, it may be necessary or desirable to include separator posts in the mid-section of the test fixture plates in addition to those spaced around the periphery of the plates. This may be accomplished with the separator posts of the present invention by including vertically aligned bores in the all plates of the test fixture except the bottom plate, that are sized for insertion of a separator post in the direction from the target plate toward the bottom plate, and including separator post slots in the guide plates that are in communication with such bores. In the same manner, the separator posts notches 40 described with regard to the preferred embodiment could be replaced with aligned bores in the all plates of the test fixture (except the bottom plate) and spaced around the periphery of the fixture. In this case the bores are sized for insertion of a separator post in the direction from the target plate toward the bottom plate. The separator posts would then be slid into separator post slots that are in communication with such bores, and fixed to the bottom and target plates with screws as described above, Furthermore, while the loading plate and the loading towers simplify the assembly process, the test fixture of the present invention may be assembled without the aid of the loading plate by simply assembling the guide plates onto the separator posts.

While the present invention has been described in terms of a preferred embodiment, it will be appreciated by one of ordinary skill that the spirit and scope of the invention is not limited to those embodiments, but extend to the various modifications and equivalents as defined in the appended claims.

What is claimed is:

1. In a test fixture of the type having a plurality of guide plates spaced apart at predetermined levels between a bottom plate and a target plate in an essentially parallel arrangement defining a horizontal fixture plane, the target plate defining a test fixture top surface and the bottom plate defining a test fixture bottom surface, and the test fixture having opposite lateral side edges defined by the opposite lateral edges of the plates, all of the plates being held in a fixed position in the test fixture by a plurality of test fixture posts spaced about the periphery of the test fixture and interconnecting the plates along an axis extending transverse to the horizontal fixture plane, and wherein all of the plates include a plurality of aligned holes bored therethrough for holding test probes capable of establishing an electrical connection between a test circuit on a printed circuit board under test and a test analyzer for testing the test circuit, the improvement comprising:

a plurality of rigid, unitary separator posts, each separator post including a plurality of identical guide plate engaging slots spaced apart along the length of the post at predetermined intervals corresponding to the predetermined levels of the guide plates, wherein the guide plates are assembled with the separator posts such that the separator posts engage the guide plates along the lateral side edges thereof and such that each guide plate engages a guide plate engaging slot at the corresponding predetermined level on a plurality of separator posts so that each guide plate is supported at such predetermined level by a plurality of separator posts and retained thereon in a fixed position relative to the other guide plates.

2. The apparatus of claim 1 further including a plurality of identical separator post receiving notches spaced around the lateral side edges of each guide plate, each such receiving notch sized to engage a guide plate engaging slot in a separator post.

3. The apparatus of claim 2 wherein each separator post receiving notch on each guide plate is vertically aligned with a separator post receiving notch on an adjacent guide plate along an axis transverse to the horizontal plate plane.

4. The apparatus of claim 2 wherein each separator post receiving notch communicates with a lateral edge of a guide plate.

5. The apparatus of claim 2 further comprising the separator post receiving notches being substantially U-shaped and the guide plate engaging slots being annular to define an outer slot diameter that is smaller than the outer diameter of the separator post, and wherein the U-shaped receiving notches are sized to match the outer slot diameter and are smaller than the outer diameter of the separator post.

6. The apparatus of claim 1 wherein each separator post further includes a bottom surface attached to the bottom plate and a top surface attached to the target plate to retain the bottom plate and the target plate in a fixed position relative to the guide plates.

7. The apparatus of claim 1 wherein each guide plate includes a plurality of loading tower alignment holes of predetermined size and spaced around the periphery thereof, the apparatus further comprising:

a removable loading plate having a plurality of upright loading towers spaced around the periphery thereof in positions corresponding to the respective positions of the loading tower alignment holes in the guide plates, each loading tower comprising a member having a plurality of guide plate support shelves vertically spaced apart at predetermined levels corresponding to the predetermined levels of the guide plates and separated by adjacent loading tower orienting posts, the guide plate support shelves and their corresponding adjacent loading tower orienting posts having respective diameters at each level which are progressively smaller, wherein the guide plates may be loaded onto the loading towers in a predetermined order such that each guide plate is supported by but not retained on a guide plate support shelf at a corresponding predetermined level.

8. The apparatus of claim 7 wherein the removable loading plate and the attached loading towers are separable from the test fixture.

9. A method of assembling a test fixture comprising the steps of:

(a) orienting a plurality of guide plates such that they are spaced apart from one another at predetermined intervals and such that the guide plates are substantially parallel, each guide plate having lateral side edges;

(b) fixing the position of the guide plates relative to one another such that they are maintained in a substantially parallel arrangement and are retained spaced apart at the predetermined intervals by engaging all of the guide plates at the lateral side edges thereof and at a plurality of locations spaced around the guide plates with a plurality of rigid, unitary separator posts, each separator post including a plurality of identical guide plate engaging slots spaced apart along the length of the separator post at predetermined intervals corresponding to the predetermined intervals between the guide plates, wherein each guide plate engages a guide plate engaging slot at the corresponding predetermined interval on a plurality of separator posts so that each guide plate is supported at such predetermined level by a plurality of separator posts and retained thereon in a fixed position relative to the other guide plates.

10. The method of claim 9 including the steps of:

(a) orienting a bottom plate parallel to the guide plates and spaced apart a predetermined interval therefrom;

(b) orienting a target plate parallel to the guide plates and spaced apart a predetermined interval therefrom;

(c) attaching the bottom plate and the target plate to a plurality of separator posts to fix the position of the bottom plate and the target plate relative to the guide plates.

11. The method of claim 9 wherein each guide plate includes a plurality of identical separator post receiving notches spaced around the peripheral lateral edges of the plate and sized to engage a guide plate engaging slot on a separator post, and wherein the method of assembling the test fixture includes the step of aligning each separator post receiving notch with a separator post receiving notch on an adjacent guide plate along an axis extending transverse to the plane defined by the guide plates prior to engaging the guide plates with the separator posts.

12. The method of claim 9 wherein each guide plate includes a plurality of loading tower alignment holes of predetermined size and spaced around the periphery thereof inwardly of said peripheral lateral edges, the method of assembling the test fixture including the steps of:

(a) sequentially loading in a predetermined order the guide plates onto a removable loading plate having a plurality of upright loading towers spaced around the periphery thereof in positions corresponding to the respective positions of the loading tower alignment holes in the guide plates, each loading tower comprising a member having a plurality of guide plate support shelves vertically spaced apart at predetermined intervals corresponding to the predetermined intervals of the guide plates and separated by adjacent loading tower orienting posts, the guide plate support shelves and their corresponding adjacent loading tower orienting posts having respective diameters at each level which are progressively smaller, such that each guide plate is supported by but not retained on a guide plate support shelf at a corresponding predetermined level;

(b) separating the loading plate and the attached loading towers from the test fixture.

* * * * *